(12) United States Patent
Kwon et al.

(10) Patent No.: US 9,424,916 B2
(45) Date of Patent: Aug. 23, 2016

(54) SEMICONDUCTOR MEMORY DEVICE AND METHOD FOR READING THE SAME USING A MEMORY CELL ARRAY INCLUDING RESISTIVE MEMORY CELLS TO PERFORM A SINGLE READ COMMAND

(71) Applicant: RESEARCH & BUSINESS FOUNDATION SUNGKYUNKWAN UNIVERSITY, Suwon-si (KR)

(72) Inventors: Keewon Kwon, Seongnam-si (KR); Jongmin Baek, Imsil-gun (KR); Dongjin Seo, Gwangju (KR)

(73) Assignee: RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 0 days.

(21) Appl. No.: 14/109,109

(22) Filed: Dec. 17, 2013

(65) Prior Publication Data
US 2014/0177322 A1 Jun. 26, 2014

(30) Foreign Application Priority Data
Dec. 26, 2012 (KR) .......................... 10-2012-0153450

(51) Int. Cl.
*G11C 29/50* (2006.01)
*G11C 13/00* (2006.01)
*G11C 29/04* (2006.01)

(52) U.S. Cl.
CPC ......... *G11C 13/0064* (2013.01); *G11C 13/004* (2013.01); *G11C 29/50008* (2013.01); *G11C 2013/0054* (2013.01); *G11C 2029/0409* (2013.01)

(58) Field of Classification Search
CPC ............ G11C 13/004; G11C 13/0064; G11C 2013/0054; G11C 13/0033; G11C 11/1673; G11C 11/5642; G11C 29/50008; G11C 8/12
See application file for complete search history.

(56) References Cited

U.S. PATENT DOCUMENTS 7,495,984 B2 2/2009 Kim et al.
7,916,537 B2* 3/2011 Haines ................ G11C 11/5642
365/185.03

(Continued)

FOREIGN PATENT DOCUMENTS

KR 10-0845811 B1 7/2008
KR 10-2010-0028932 A 3/2010

(Continued)

OTHER PUBLICATIONS

Close, G. F., et al. "A 512Mb phase-change memory (PCM) in 90nm CMOS achieving 2b/cell." VLSI Circuits (VLSIC), 2011 Symposium on. IEEE, 2011.

(Continued)

*Primary Examiner* — Hoai V Ho
*Assistant Examiner* — Roberto Mancera

(57) ABSTRACT

Disclosed are a semiconductor memory apparatus, and verify read method and system. The semiconductor memory apparatus includes a memory cell array including a plurality of resistive memory cells; and a control block controlling a resistance state of the memory cell to be discriminated based on a digital code value of at least 2 bits or more reflecting the resistance states of the plurality of resistive memory cells. Therefore, data of the memory is discriminated by analyzing distribution of the digital code values to monitor a characteristic of a current memory cell array and read the data having reliability.

12 Claims, 13 Drawing Sheets

(56) References Cited

U.S. PATENT DOCUMENTS

| | | | | |
|---|---|---|---|---|
| 8,271,856 | B2* | 9/2012 | Kang | G06F 11/1048 365/185.03 |
| 8,386,884 | B2* | 2/2013 | Chen | G06F 11/1072 365/185.03 |
| 8,578,246 | B2* | 11/2013 | Mittelholzer | G06F 11/1072 714/755 |
| 8,792,272 | B2* | 7/2014 | Bandic | G11C 13/0035 365/148 |
| 8,839,076 | B2* | 9/2014 | Mittelholzer | H03M 13/251 714/773 |
| 8,861,256 | B2* | 10/2014 | Ordentlich | G06F 11/1048 365/148 |
| 8,943,388 | B2* | 1/2015 | Guyot | G06F 11/0793 714/764 |
| 9,053,051 | B2* | 6/2015 | Ramamoorthy | G06F 11/1068 |
| 9,104,568 | B2* | 8/2015 | Karidis | G06F 11/0751 |
| 9,136,015 | B2* | 9/2015 | Anholt | G06F 11/1072 |
| 9,183,078 | B1* | 11/2015 | Zhu | G06F 11/10 |
| 9,208,871 | B2* | 12/2015 | Bandic | G11C 13/0035 |
| 9,235,467 | B2* | 1/2016 | Micheloni | G06F 11/1012 |
| 9,235,488 | B2* | 1/2016 | Norrie | G06F 11/2215 |
| 2005/0213189 | A1* | 9/2005 | Schroeder | 359/291 |
| 2009/0296452 | A1* | 12/2009 | Tonomura | G11C 13/0004 365/148 |
| 2010/0027326 | A1* | 2/2010 | Kim | G11C 13/0069 365/163 |
| 2010/0085799 | A1* | 4/2010 | Cho et al. | 365/148 |
| 2010/0085826 | A1* | 4/2010 | Kang et al. | 365/201 |
| 2010/0103722 | A1* | 4/2010 | Nirschl et al. | 365/163 |
| 2010/0321987 | A1* | 12/2010 | Lung | G11C 13/0004 365/163 |
| 2010/0332895 | A1* | 12/2010 | Billing | G06F 11/1008 714/6.13 |
| 2011/0026303 | A1* | 2/2011 | Choi et al. | 365/148 |
| 2011/0161544 | A1* | 6/2011 | Chengson et al. | 710/305 |
| 2011/0235403 | A1* | 9/2011 | Kang | 365/148 |
| 2011/0317480 | A1* | 12/2011 | Lung | G11C 13/0004 365/163 |
| 2013/0103888 | A1* | 4/2013 | Ordentlich | G11C 16/00 711/103 |
| 2013/0107611 | A1* | 5/2013 | Cai et al. | 365/158 |
| 2013/0113516 | A1* | 5/2013 | Luo | H03K 19/0005 326/30 |
| 2013/0258753 | A1* | 10/2013 | Gopinath et al. | 365/148 |
| 2014/0059404 | A1* | 2/2014 | Okubo et al. | 714/768 |
| 2014/0153315 | A1* | 6/2014 | Kwon | G11C 13/0033 365/148 |
| 2014/0278160 | A1* | 9/2014 | Wei et al. | 702/58 |
| 2014/0281800 | A1* | 9/2014 | Micheloni | G06F 11/1012 714/759 |
| 2015/0227420 | A1* | 8/2015 | Oh | G11C 29/52 714/764 |
| 2015/0254131 | A1* | 9/2015 | Torii | G06F 11/1068 714/764 |
| 2016/0141027 | A1* | 5/2016 | Yon | G11C 13/004 365/148 |

FOREIGN PATENT DOCUMENTS

| | | |
|---|---|---|
| KR | 10-2010-0013125 A | 9/2010 |
| KR | 10-2011-0101012 A | 9/2011 |

OTHER PUBLICATIONS

Korean Office Action issued on Jan. 27, 2014 for the corresponding Korean Patent Application No. 10-2012-0153450 (6 pages in Korean).

Korean Office Action issued on Jan. 7, 2015 for the corresponding Korean Patent Application No. 10-2012-0153450 (5 pages in Korean).

Korean Notice of Allowance issued on Jul. 28, 2015 for the corresponding Korean Patent Application No. 10-2012-0153450 (6 pages in Korean).

* cited by examiner

FIG. 8
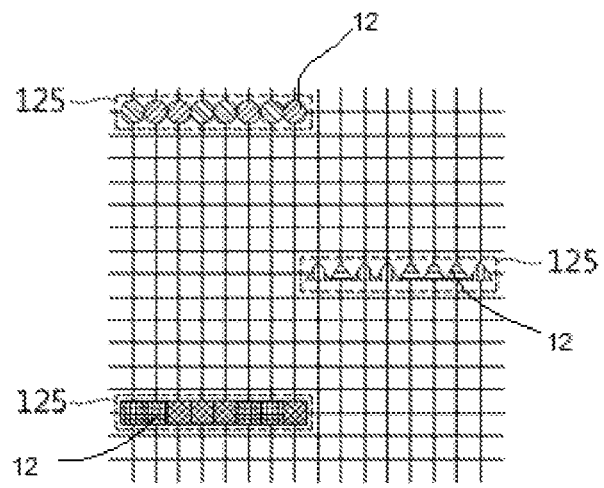
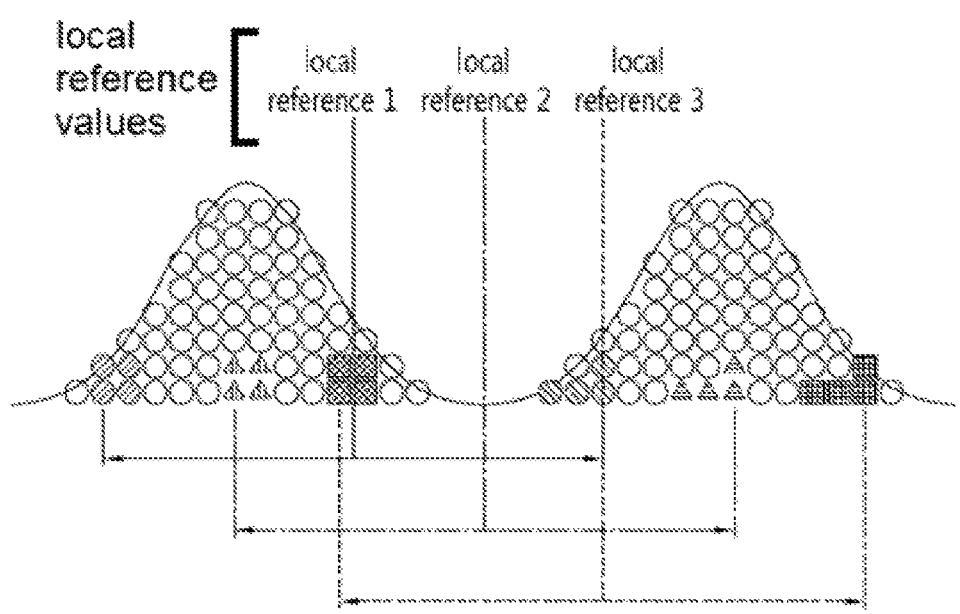

SEMICONDUCTOR MEMORY DEVICE AND METHOD FOR READING THE SAME USING A MEMORY CELL ARRAY INCLUDING RESISTIVE MEMORY CELLS TO PERFORM A SINGLE READ COMMAND

This application claims the benefit of priority of Korean Patent Application No. 10-2012-0153450 filed on Dec. 26, 2012, which is incorporated by reference in its entirety herein.

BACKGROUND OF THE INVENTION

1. Field of the Invention

The present invention relates to a semiconductor memory apparatus, and verify read method and system, and more particularly, to an apparatus, a method, and a system of performing a memory read by using statistical distribution.

2. Discussion of the Related Art

A demand for a non-volatile memory that requires low power consumption, a small dimension, a high speed, and high reliability has increased with propagation of mobile devices. An existing charge storage type non-volatile memory (NVM) has been in accord with such a specification while reducing the size of a device with the development of semiconductor process technology. However, in recent years, a new memory has been actively researched while memory process technology has experienced difficulties in reducing the size of the device. At preset, resistive type memories primarily including a phase charge random access memory (PCRAM), a resistive random access memory (ReRAM), a magnetic random access memory (MRAM), and the like attract public attentions, which distinguish data by using a resistance change. The resistive type memories have advantages including high integrity, a high switching speed, low power consumption, and the like. However, since the resistive type memories have a wide distribution of resistance values, the resistive type memories have a difficulty in distinguishing data. Due to various elements including disturbance associated with reading and writing of neighboring cells, a change in resistance value depending on a temperature and time, a change in resistance value depending on repeated reading/writing operations as well as such a difficulty, a probability in failing to distinguishing data is increased when the data is distinguished based on a predetermined reference.

In order to overcome the difficulties, a research into a method of reading data by using a variable reference in a resistive change memory has been made in recent years (see U.S. patent Registration No. 7,495,984).

FIG. 1 is a diagram for describing a method of generating a reference in the related art. As illustrated in FIG. 1, U.S. patent Registration No. 7,495,984 mentions that when a reference is generated by using a plurality of cells which is positioned in the same block where a cell to be sensed is positioned, a midpoint reference can be generated by using some cells and a reference voltage is generated by using cells in a memory array, and as a result, a local change of a resistance value can be reflected. However, it is difficult to determine that such a reference is a reference to correctly distinguish all cells in an array block in which a voltage of the midpoint reference generated by using just some cells is significantly high due to a characteristic of the resistive type memory having a large distribution. For example, if $R_{max}$ of FIG. 1 has a smallest value in a high resistive state (HRS) (data "0") distribution and $R_{min}$ also has the smallest value in a low resistive state (LRS) (data "1") distribution, a reference voltage generated herein generates a reference which is inclined toward the LRS, and as a result, a probability in failing to sensing LRS cells having a relatively higher resistive distribution is increased.

SUMMARY OF THE INVENTION

In order to solve the above-mentioned problems, an object of the present invention provides a semiconductor memory apparatus, and verify read method and system that vary a reference value discriminating a state value of data by analyzing resistance distribution of a resistive memory based on a digital code value reflecting a resistance state of the resistive memory to perform reading of the data having reliability.

Another object of the present invention also provides a semiconductor memory apparatus, and verify read method and system that may discriminate the state value of the data as a predetermined reference value by analyzing resistance distribution of the resistive memory based on the digital code value reflecting the resistance state of the resistive memory.

In accordance with an embodiment of the present invention, a semiconductor memory apparatus, including: a memory cell array including a plurality of resistive memory cells; and a control block controlling a resistance state of the memory cell to be discriminated based on a digital code value of at least 2 bits or more reflecting the resistance states of the plurality of resistive memory cells.

The digital code value may be generated as the digital code value of at least 2 bits according to a degree in which the resistance states of the plurality of resistive memory cells deviate from a target value by monitoring the resistance states of the plurality of resistive memory cells.

The control block may discriminate a state value (including SET(1) or RESET(0)) of data by analyzing distribution of the plurality of resistive memory cells based on the digital code value, without a predetermined reference, during verify read with respect to the plurality of DC-balanced resistive memory cells.

The control block may arrange the state value according to size based on the digital code value during the verify read, and discriminates the state value of the data based on the arranged order.

The control block may arrange the plurality of resistive memory cells according to size based on the digital code value, and discriminate memory cells having a larger value than a half of all the memory cells to have a first state value and memory cells having a smaller value than a half of all the memory cells to have a second state value.

The control block may control the plurality of resistive memory cells to be stored in a DC-balanced state by decoding during the write operation.

The control block may vary a reference value discriminating a state value (including SET(1) or RESET(0)) of the data by analyzing distribution of the plurality of resistive memory cells based on the digital code value during the verify read operation.

The control block may discriminate binary data stored in the resistive memory cell by using a most significant bit (MSB) of the digital code value, and acquire distribution information of the plurality of resistive memory cells by using the remaining bit value.

The control block may group the plurality of resistive memory cells into a first group and a second group based on the information related with the distribution of the plurality of resistive memory cells, and vary the reference value based on at least one of an average value, a central value, a standard deviation, and minimum and maximum of the resistive memory cells belonging to the first group and the resistive memory cells belonging to the second group.

The control block may vary the reference value as an average value of a maximum of the digital code values of the resistive memory cells belonging to the first group and a minimum of the digital code values of the resistive memory cells belonging to the second group.

The control block may set a local reference value by using the digital code value by a read unit accessed once.

The read unit accessed once may be encoded so that at least one cell having the respective state values of SET(1) and RESET(0) exists. The control block may set a median value between the digital code value of the farthest cells on the distribution of the digital code values of the resistive memory cells belonging to the read unit as the local reference.

The control block may control a refresh operation to be performed in order to compensate for a deterioration characteristic of the resistive memory cell when a distance between the digital code values of the farthest cells is not beyond a predetermined reference value.

The control block may group the plurality of resistive memory cells into a first group and a second group based on the information related with the distribution of the plurality of resistive memory cells, and manage the plurality of resistive memory cells based on whether resistive memory cells deviates from first and second references by applying the first reference to the first group and the second reference to the second group.

The first group may be a group representing a high resistance state (HRS), and the second group may be a group representing a low resistance state (LRS), and the resistive memory cells belonging to the first group having a lower value than the first reference and the resistive memory cells belonging to the second group having a higher value than the second reference may be recognized to have a performance deterioration risk to generate risk sensing signals.

The control block may control the resistive memory cells belonging to the first group and the second group which are beyond the first and second references to perform the refresh operation.

In accordance with another embodiment of the present invention, a verify read method of a semiconductor memory apparatus, including: generating digital code values reflecting resistance states of a plurality of resistive memory cells; and controlling a resistance state of the memory cell to be discriminated based on a digital code value of at least 2 bits or more reflecting the resistance states of the plurality of resistive memory cells.

The controlling may include discriminating a state value (including SET(1) or RESET(0)) of data by analyzing distribution of the plurality of resistive memory cells based on the digital code value, without a predetermined reference, during verify read with respect to the plurality of DC-balanced resistive memory cells.

In accordance with yet another embodiment of the present invention, a semiconductor memory system includes: a semiconductor memory apparatus; and a processor for controlling a write operation and a verify read operation of the semiconductor memory apparatus, in which the semiconductor memory apparatus includes a memory cell array including a plurality of resistive memory cells; and a control block controlling a resistance state of the memory cell to be discriminated based on a digital code value of at least 2 bits or more reflecting the resistance states of the plurality of resistive memory cells.

According to the semiconductor memory apparatus, and the verify read method and system, data of the memory is discriminated by analyzing distribution of the digital code values, thereby monitoring a characteristic of a current memory cell array and reading the data having reliability.

BRIEF DESCRIPTION OF THE DRAWINGS

FIG. 8 is a diagram for describing varying a reference by determining resistance distribution according to a position of an array of the semiconductor memory apparatus according to the embodiment of the present invention.

DETAILED DESCRIPTION OF THE EMBODIMENTS

Figure 1:
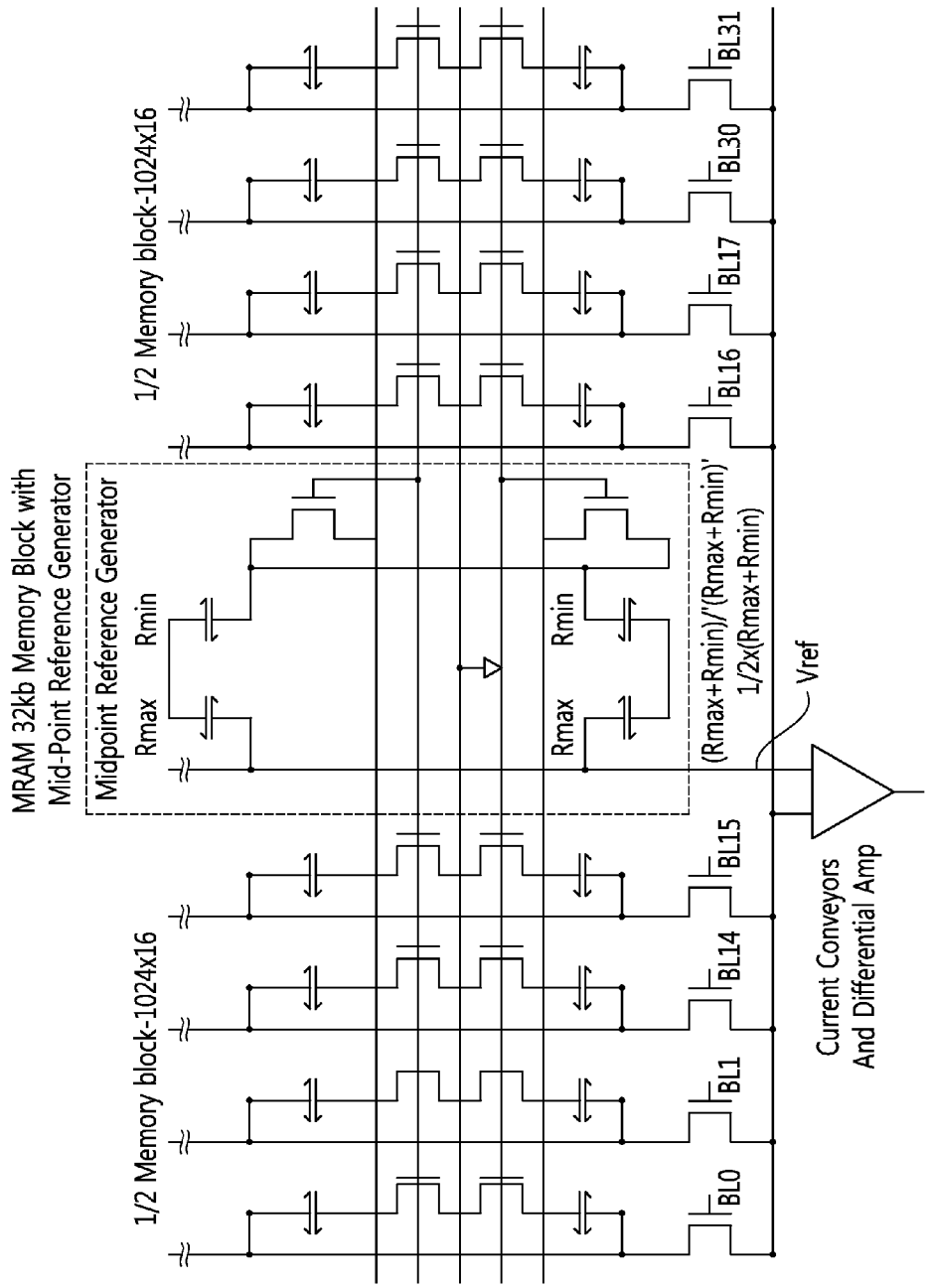
FIG. 1 is a diagram for describing a method of generating a reference in the related art.

The present invention may have various modifications and various exemplary embodiments and specific exemplary embodiments will be illustrated in the drawings and described in detail.

However, this does not limit the present invention within specific exemplary embodiments, and it should be understood that the present invention covers all the modifications, equivalents and replacements within the idea and technical scope of the present invention.

Terms such as first or second may be used to describe various components but the components are not limited by the above terminologies. The above terminologies are used only to discriminate one component from the other component. For example, without departing from the scope of the present invention, a first component may be referred to as a second component, and similarly, a second component may be referred to as a first component. A terminology such as and/or includes a combination of a plurality of associated items or any item of the plurality of associated items.

It should be understood that, when it is described that an element is "coupled" or "connected" to another element, the element may be "directly coupled" or "directly connected" to the another element or "coupled" or "connected" to the another element through a third element. In contrast, it should be understood that, when it is described that an element is "directly coupled" or "directly connected" to another element, it is understood that no element is not present between the element and the another element.

Terms used in the present application are used only to describe specific exemplary embodiments, and are not intended to limit the present invention. A singular form may include a plural form if there is no clearly opposite meaning in the context. In this specification, terms such as "comprise", "include", or "have" are used to designate presence of implemented features, figures, steps, operations, elements, parts, or combinations thereof and it should be understood that presence or addition possibilities of other features or figures, steps, operations, elements, parts, or combinations thereof are not excluded in advance.

If it is not contrarily defined, all terms used herein including technological or scientific terms have the same meaning as those generally understood by a person with ordinary skill in the art. Terms which are defined in a generally used dictionary should be interpreted to have the same meaning as the meaning in the context of the related art but are not interpreted as an ideally or excessively formal meaning if it is not clearly defined in the present invention.

Hereinafter, a preferable embodiment of the present invention will be described in more detail with reference to the accompanying drawings. In describing the present invention, like reference numerals refer to like elements for easy overall understanding and a duplicated description of like elements will be omitted.

Figure 2:
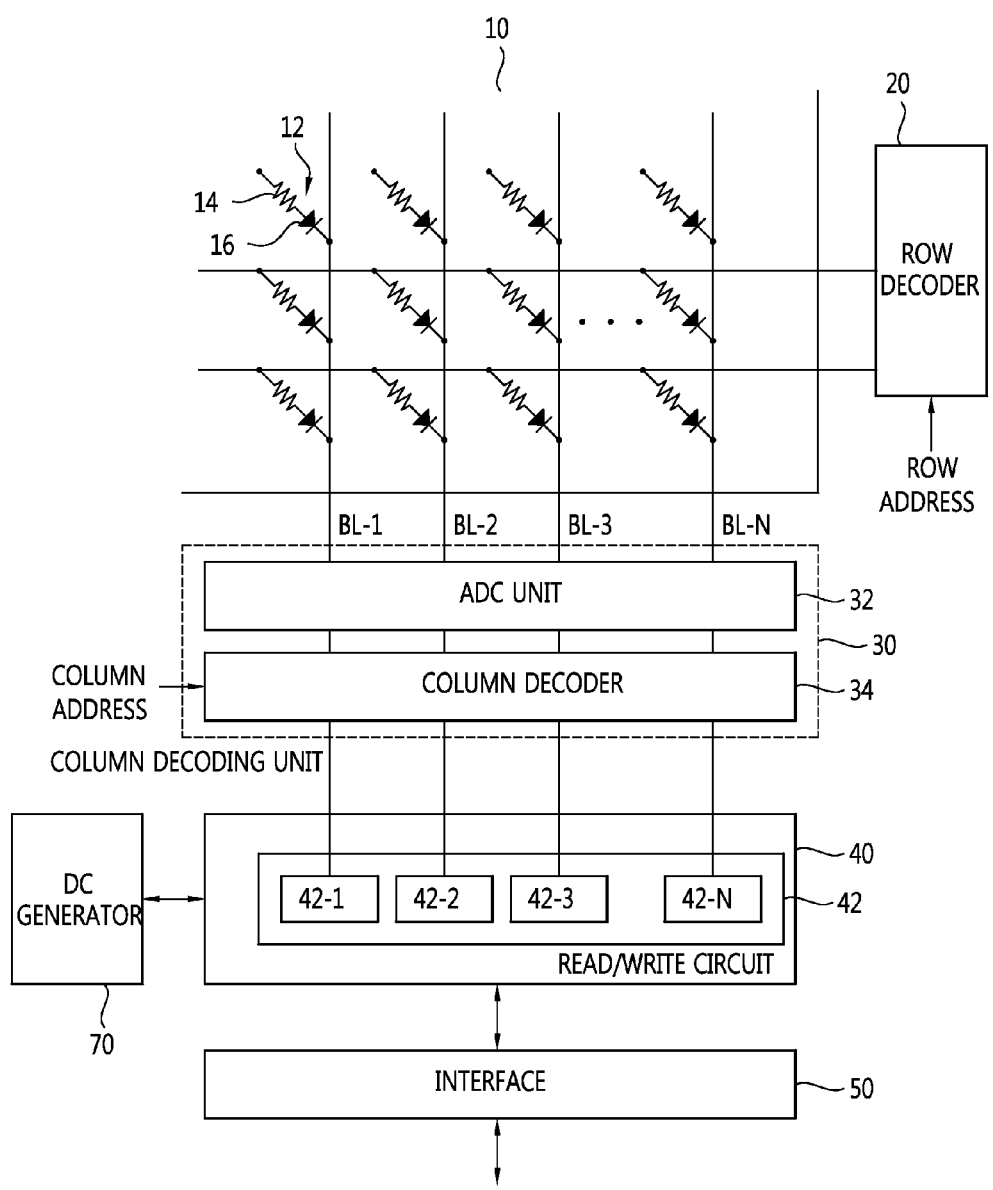
FIG. 2 is a block diagram schematically illustrating a configuration of a semiconductor memory apparatus according to an embodiment of the present invention.

FIG. 2 is a block diagram schematically illustrating a configuration of a semiconductor memory apparatus according to an embodiment of the present invention. As illustrated in FIG. 2, a semiconductor memory apparatus may include a memory cell array 10, a row decoder 20, a column decoder 30, a control block 40, an interface 50, and a DC generator 70.

The memory cell array 10 may include a plurality of bit lines BL1 to BLN, a plurality of word lines WL1, WL2, WL3, . . . , and a plurality of resistive memory cells 12.

The plurality of resistive memory cells 12 each uses a resistance of a resistive memory element 14 in order to store one bit or one or more bits of data. For example, a resistive memory element 14 programmed to have a high resistance may express a logic "0" data bit value, and a resistive memory element 14 programmed to have a low resistance may express a logic "1" data bit value.

The plurality of resistive memory cells 12 each may include a resistive memory element 14 and an access device 16 for controlling a current flowing in the resistive memory element 14. In some cases, the resistive memory element 14 is called a memory cell or a memory material.

Further, the plurality of resistive memory cells 12 each may be implemented as a ReRAM, a phase change random access memory (PRAM), or a flash memory. The PRAM called a PCRAM or an ovonic unified memory (OUM) may use a phase change material for the resistive memory element 14.

Further, the resistive memory element 14 may be implemented by phase change materials having different resistances according a crystalline state or an amorphous state.

The access device 16 is called an isolation device, and may be implemented as a diode-type, an MOSFET-type, or a BJT-type. In the drawing, a diode-type access device 16 is illustrated, but the present invention is not necessarily limited thereto.

The row decoder 20 decodes a row address (RA) to select at least one word line (or row) among the plurality of word lines WL1, WL2, WL3, . . . . The column decoder 34 decodes a column address (CA) to select at least one bit line (or column) among the plurality of bit lines BL1 to BLn.

The column decoder 30 includes an ADC unit 32 and a column decoder 34. The ADC unit 32 may include a plurality of ADCs. The ADC unit 32 reflects a resistance state of the resistive array cell 12 to generate a digital code value. That is, the ADC unit 32 monitors the resistance states of the plurality of resistive memory cells 12 to generate a digital code value having a predetermined bit number depending on a degree in which the resistance states of the plurality of resistive memory cells 12 deviate from a target value. For example, one ADC is disposed for every eight bit lines to sense a current flowing in the bit line connected with the memory cells 12 by a unit of eight resistive memory cells 12 and generate a digital code value having a predetermined bit number.

According to the embodiment of the present invention, the ADC unit 32 may generate a digital code value of at least 2 bits or more. In some case, a 5-bit ADC 32 generating a digital code value of 5 bits may be used.

When a characteristic of the resistive memory cell 14 is changed by consecutive read/write operations, the control block 40 may discriminate a state value of data by analyzing distribution of the resistive memory cell 12 based on a digital code value associated with the resistance of the resistive memory cell 12 provided from the ADC unit 32. The state value may have a value of SET(1) or RESET(0) as a binary value of the data.

The control block 40 may determine a resistance state of the resistive memory cell 12 by arranging digital code values according to size and discriminate a state value of the data based on the determined resistance state.

Further, the control block 40 may vary a reference value used for discriminating the state value based on the generated digital code value through the ADC unit 32. For example, when the resistance distribution is concentrated toward high resistance, the reference value moves toward the high resistance by a predetermined section to reduce an error of the state value of the data. That is, the reference value may properly vary according to distribution of all the resistive memory cells 12.

Further, the control block 40 may control a write operation (or a program operation) and a verify read operation to be repetitively performed while increasing a voltage applying time (or a program time, a pulse duration) for programming (or recoding, writing) program data (or record data) in the resistive memory cell 12 based on the digital code value.

Here, the write operation (or program operation, record operation) means an operation of making a resistance of the resistive memory element 14 of the resistive memory cell 12 to a high resistance or a low resistance by supplying a voltage pulse or a current pulse to the resistive memory cell 12.

The refresh operation may be performed by a method similar to the aforementioned write operation. That is, the refresh operation means an operation of making a desired high resistance or low resistance by applying a voltage pulse (refresh pulse (expressed as a write power voltage in some cases)) based on a resistance state of the resistive memory element 14.

The control block 40 may include a read/write circuit 42. Alternatively, the read/write circuit 42 may also be configured by a separate block which is not included in the control block 40. The control block 40 may control the DC generator 70 controlling an initial voltage magnitude and/or an initial voltage applying time. For example, the DC generator 70 may generate a pulse signal $V_{WR}$ of which the initial voltage magnitude and/or the initial voltage applying time (a pulse duration or a pulse width) of the write operation and/or the refresh operation increases, in order to correct a degree that deviates from the initial resistance as the number of read operations and/or program operations (for example, reset operations) increases.

The interface 60 performs serves to transmit and receive program data (or record data) or read data between the control block 40 and a host (not illustrated).

Figure 3:
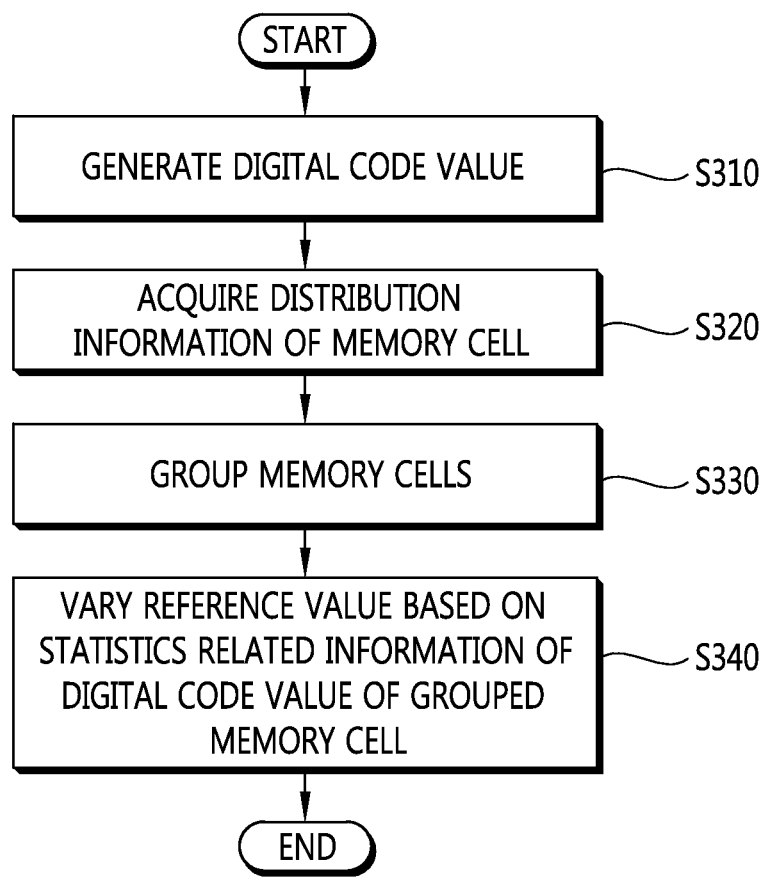
FIG. 3 is a flowchart schematically illustrating a verify read process of the semiconductor memory apparatus according to the embodiment of the present invention.

FIG. 3 is a flowchart schematically illustrating a verify read process of the semiconductor memory apparatus according to the embodiment of the present invention.

Referring to FIG. 3, the semiconductor memory apparatus senses a resistance of the memory cell 12 in the resistive memory (for example, a ReRAM) array 10 to generate a digital code value (S310). In this case, the ADC 32 may be used. The digital code value may be generated as a digital code value of at least 2 bits by monitoring the resistance state of the resistive memory cell 12 based on how much the resistance value deviates from a target value. According to a preferable embodiment of the present invention, the semiconductor memory apparatus may generate a digital code value of 5 bits by using a 5-bit ADC 32.

Figure 4:
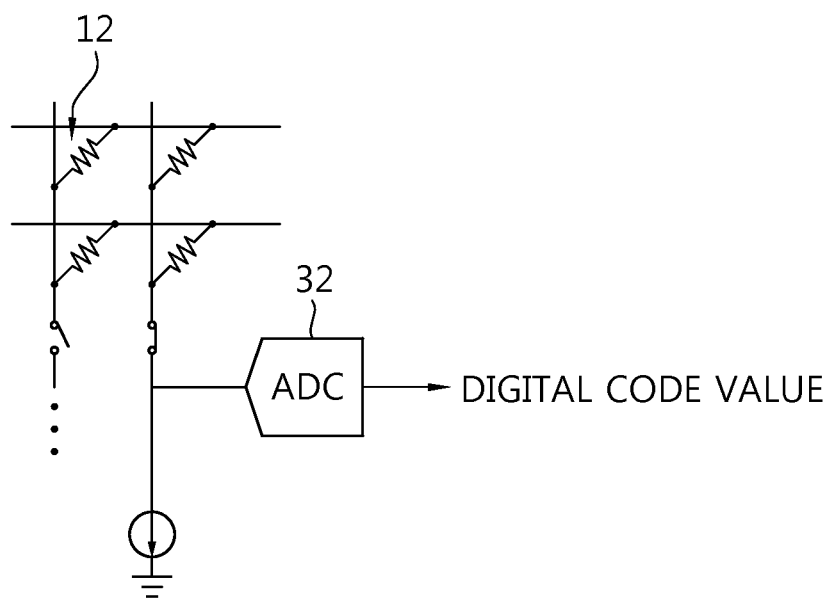
FIG. 4 is a diagram for describing generation of a digital code value of the semiconductor memory apparatus according to the embodiment of the present invention.

FIG. 4 is a diagram for describing generation of a digital code value of the semiconductor memory apparatus according to the embodiment of the present invention. As illustrated in FIG. 4, according to the embodiment of the present invention, the semiconductor memory apparatus may generate a digital code value by sensing a current value output through the bit line while connecting the ADC 32 to the bit line of each memory cell 12. The ADC 32 replaces a bit line sense amplifier (BLSA) in the related art. One ADC 32 may be disposed for every eight memory cells 12.

Referring back to FIG. 3, after generating the digital code value, the semiconductor memory apparatus acquires distribution information of the memory cell 12 based on the generated digital code value. That is, binary data stored in each memory cell 12 may be determined by using a most significant bit (MSB) of the digital code value acquired in the generating of the digital code value (S310). In addition, the distribution information may be determined by using the remaining bits except for the MSB. The resistance state of the memory cell 12 may be accurately determined as compared with determining the resistance state of the memory cell 12 approximately by an analog method, by analyzing the distribution through the digital code value. Particularly, as the bit number of the digital code value is increased, the resistance state of the may be more accurately output. The semiconductor memory apparatus may generate a distribution map based on the distribution information of the memory cell 12 through the digital code value to determine a statistical characteristic of the distribution. The statistical characteristic means a statistical value including an average, a median value, a standard deviation, variance, maximum/minimum, and the like of the digital code values of all the memory cells 12. That is, the resistance state of the current memory cell 12 may be multilaterally analyzed through the statistical characteristic, and a memory cell 12 having a fail risk may be detected.

In addition, the semiconductor memory apparatus groups the memory cells 12 based on the distribution information (S330).

Figure 5:
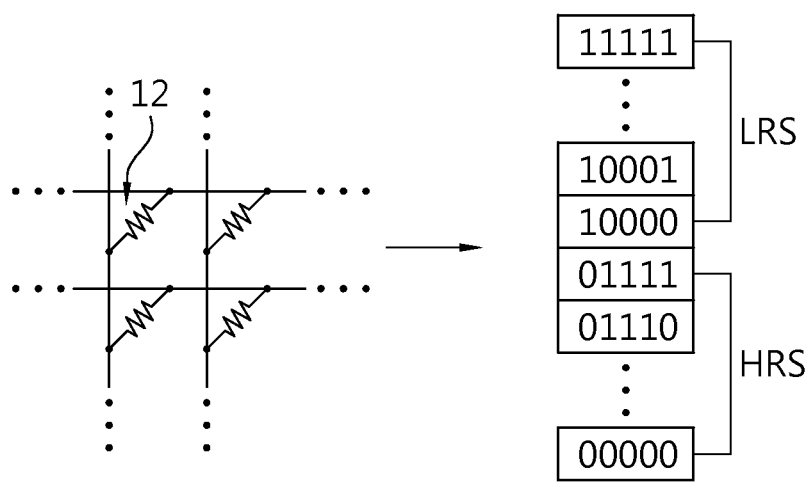
FIG. 5 is a diagram for describing grouping according to a resistance state of a resistive memory cell based on a digital code value of the semiconductor memory apparatus according to the embodiment of the present invention.

FIG. 5 is a diagram for describing grouping according to a resistance state of a resistive memory cell based on a digital code value of the semiconductor memory apparatus according to the embodiment of the present invention.

Referring to FIG. 5, the semiconductor memory apparatus may determine resistance state distribution of the memory cells 12 through digital code values of 5 bits, and group the memory cells 12 based on the resistance state distribution. That is, the memory cells 12 may be divided into an LRS group and an HRS group based on a most significant bit of the digital code value of 5 bits, and the resistance states of the memory cells 12 may be expressed to be recognizable at a glance by arranging the digital code values according to size even in the divided groups. In FIG. 5, 10000 to 11111 belong to the LRS group, and the state value may be output as '1', but it may be verified that 11111 represents a memory cell 12 having a good resistance state, and 10000 represents a memory cell 12 which is very bad, that is, has very high fail possibility. That is, the memory cell 12 having the digital code value of 10000 is a memory cell 12 having possibility to be read as the state value of '0' according to a reference. Movement of the reference may be required for the memory cell 12 having the high fail risk.

According to another embodiment of the present invention, many advantages may be taken from a subsequent process by converting and determining the distribution into the digital code value. For example, when the array cell is read by a byte unit, a distance between the HRS/LRS groups is monitored to be decreased and then the refresh operation is performed, thereby securing a stable cell characteristic.

Figure 6:
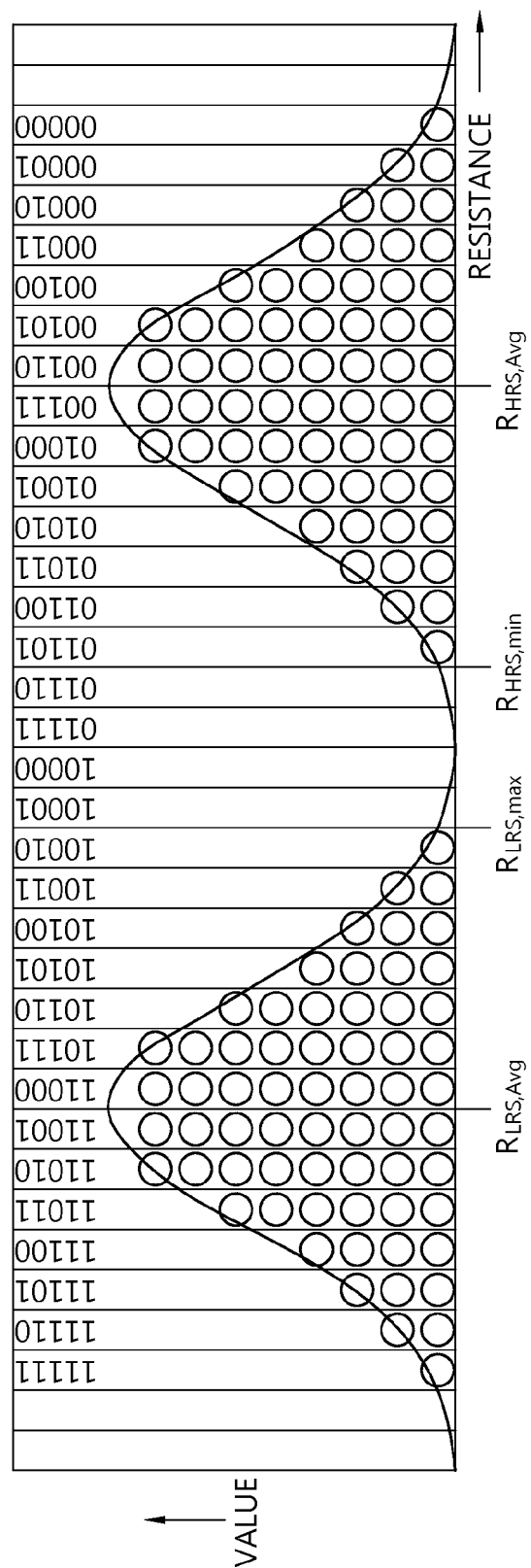
FIG. 6 is a diagram illustrating a resistance distribution analysis result of a resistive memory cell according to a digital code value of the semiconductor memory apparatus according to the embodiment of the present invention.

FIG. 6 is a diagram illustrating a resistance distribution analysis result of a resistive memory cell according to a digital code value of the semiconductor memory apparatus according to the embodiment of the present invention. As illustrated in FIG. 6, the semiconductor memory apparatus may analyze distribution based on digital code values representing the resistance states of the resistive memory cells 12.

Referring to FIG. 6, the resistive memory cells 12 may be divided into two groups HRS and LRS based on the digital code values, and various statistical values such as an average, and minimum/maximum may be calculated based on the digital code values of the grouped memory cells 12. In the case of the resistive memory, when describing the distribution of resistances, a ratio of $R_{HRS,Avg}$ (an average value of the digital code values of the memory cells 12 belonging in the HRS group)/$R_{LRS,Avg}$ (an average value of the digital code values of the memory cells 12 belonging in the LRS group) is high, but a change of the resistance in the HRS/LRS state is increased, and as a result, a distance between $R_{HRS,min}$ (a minimum of the digital code values of the memory cells 12 belonging in the HRS group)/$R_{LRS,max}$ (a maximum of the digital code values of the memory cells 12 belonging in the LRS group) is not sufficiently large, or the size may be reversed. Accordingly, in order to set a global reference between the HRS/LRS groups, a margin of the distance between the $R_{HRS,min}$ and the $R_{LRS,max}$ is insufficient, and in this case, in order to solve the insufficient margin, the movement of the reference may be considered.

Particularly, as illustrated in FIG. 6, the memory cells 12 may not have predetermined values, but have a wide distribution characteristic. The distribution characteristic may be divided into several steps by discriminating the resistance states by using the ADC 32. FIG. 6 illustrates output of the digital code values of 5 bits, and here, the most significant bit (MSB) is a result of discriminating the HRS/LRS, and the remaining lower bits represent distribution of resistances in the LRS and HRS groups. The data of the memory is discriminated by analyzing the acquired digital code distribution to monitoring the characteristic of the current memory cell array 10 and read the data with reliability.

Referring back to FIG. 3, when the grouping of the memory cells 12 is completed, the semiconductor memory apparatus may vary the reference value based on statistics related information of the digital code values of the grouped memory cells 12 (S340). For example, the semiconductor memory apparatus may vary the reference value by using at least one of an average, a median value, a standard deviation, and minimum/maximum of the digital code values of the grouped memory cells 12.

Figure 7:
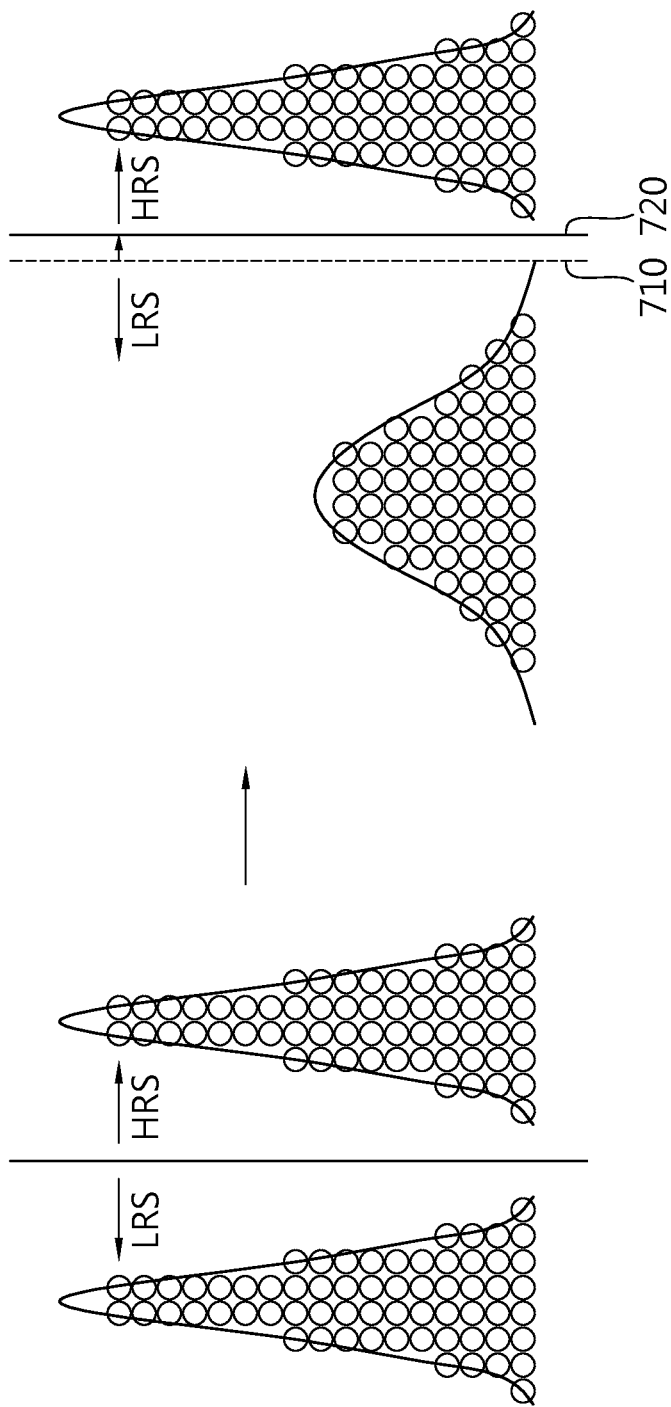
FIG. 7 is a diagram for describing reference movement for discriminating a state value of a semiconductor memory apparatus according to the embodiment of the present invention.

FIG. 7 is a diagram for describing reference movement for discriminating a state value of a semiconductor memory apparatus according to the embodiment of the present invention. Just after the write operation, as illustrated in the left drawing of FIG. 7, all the HRS/LRS have small distribution, and then as illustrated in the right drawing of FIG. 7, the distribution of the LRS may be widened due to various factors.

Referring to FIG. 7, even in the case where the distribution of the LRS is widened, when the data is always discriminated by only a predetermined reference 710 (marked by a dotted line), fail possibility may occur according to a distribution change. That is, like the left drawing of FIG. 7, when a central value of the average in the HRS/LRS distribution having the same distribution is set as the reference, there is no problem, but like the right drawing of FIG. 7, when a central value in the HRS/LRS distribution having different distribution is set as the reference, a margin size of the HRS/LRS varies, and as a result, the sensing process is ineffective, and fail possibility increases. Accordingly, when considering the standard deviation, it may be efficient that a new reference 720 (marked by a solid line) moves to an average value of $R_{HRS,min}$ and $R_{LRS,max}$ other than an average of the respective central values of the HRS group and the LRS group. Accordingly, when the distribution is traced through read based on the ADC 32, a reference maximizing reliability may be organically changed.

According to the embodiment of the present invention, the semiconductor memory apparatus does not necessarily vary the reference by only the average value of $R_{HRS,min}$ and $R_{LRS,max}$, but may vary the reference by using values related with other statistical characteristics, for example, an average, a central value, a distribution, a standard deviation, and minimum/maximum of the digital code values of all the memory cells 12 and an average, a central value, a distribution, a standard deviation, and minimum/maximum of each group of the grouped memory cells 12.

FIG. 8 is a diagram for describing varying a reference by determining resistance distribution according to a position of an array of the semiconductor memory apparatus according to the embodiment of the present invention. As illustrated in FIG. 8, the semiconductor memory apparatus according to the embodiment of the present invention does not determine the distribution of the entire memory chip, but determines a distribution in a bit array that is accessed together at once by using a property that adjacent cells in the chip have similar distribution characteristics, to set a local reference for a read unit 125.

Referring to FIG. 8, the adjacent cells generally have similar distribution characteristics. In FIG. 8, the memory cells 12 expressed by a circle, a triangle, and a rectangle are a cell set accessed to the read circuit once as the adjacent cells. Here, marking different hatchings mean the memory cells 12 having different state values. The semiconductor memory apparatus according to the embodiment of the present invention may determine the distribution of the entire chip and vary the reference discriminating the state value of the data by using the determined distribution, but the reference may be more efficiently controlled by setting the local reference for a read unit 125 with the adjacent cells in the chip.

In FIG. 8, when the distribution is evaluated by using 8 bits expressed by eight circles that are read together at once, 8 bits expressed by a triangle, and 8 bits expressed by a rectangle, the data '0' group and the data '1' group may be certainly discriminated. However, in order to set the local reference, at least one cell in the HRS/LRS state needs to exist in the bit array that is accessed together at once, and it may be solved through coding. The memory cells 12 in a read unit 125 that are accessed together at once are DC-balanced by encoding to be set to have at least one state value of '0' and '1'. According to another embodiment of the present invention, the state value of '0' and '1' may be set to have a uniform ratio at the same number.

In this case, the distribution, in which the cells expressed by the circles are at the left of the '0' and '1' groups, the cells expressed by the triangles are at the center of the '0' and '1' groups, and the cells expressed by the rectangles are at the right of the '0' and '1' groups, is illustrated, and as described above, the adjacent cells in both groups may have similar distribution. In this case, when a predetermined reference is continuously maintained, the reference is applied to the adjacent cells in which the distribution is concentrated to one side, and as a result, fail possibility is increased and read reliability may be decreased. Accordingly, since the memory cells included in each read unit have at least one of '0' and '1', a median value of the distance between the cells in which the distance between the resistances is farthest may be set. That is, a median value between a cell disposed at the leftmost side of the cells expressed by the circles and a cell disposed at the rightmost side is set as a local reference to discriminate the state value of the data of the cells expressed by the circles. The state values for the cells expressed by the triangles and the rectangles may be discriminated by the same method.

In this case, when the distance between the farthest cells is not noticeable, the refresh operation is performed to compensate for the deterioration characteristic. Whether the distance between the cells is noticeable or not may be determined by determining whether the distance between the cells is farther than a reference value by setting the special reference value.

Figure 9:
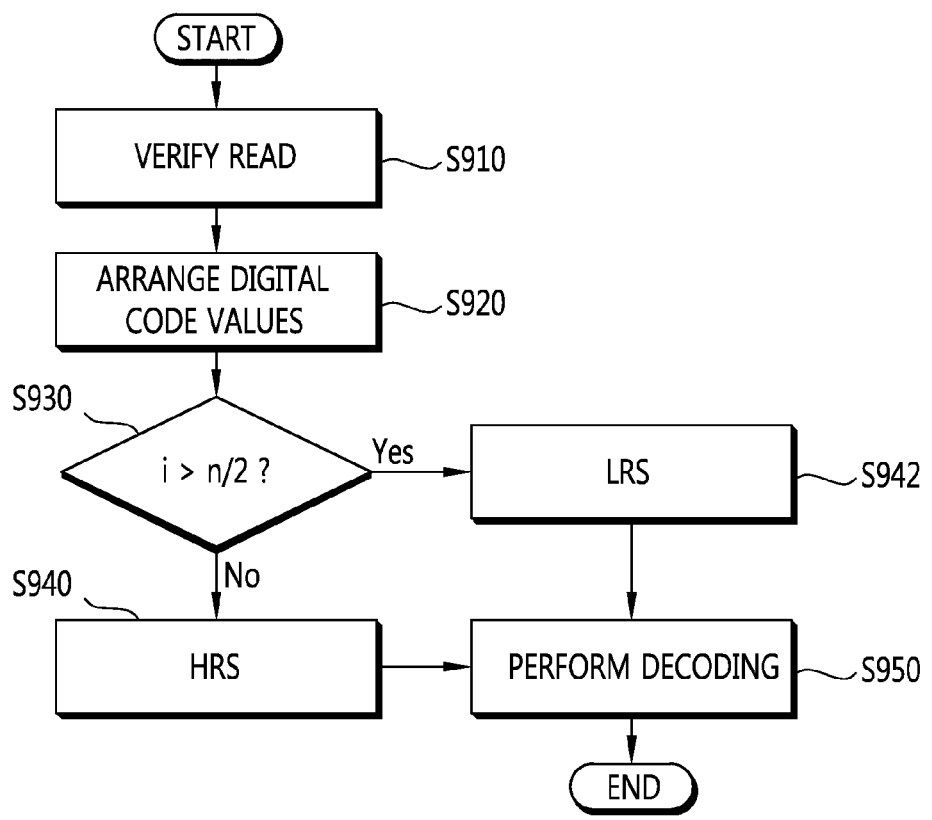
FIG. 9 is a diagram for describing a process of discriminating a state value without a specific reference through digital coding of a semiconductor memory apparatus according to another embodiment of the present invention.

FIG. 9 is a diagram for describing a process of discriminating a state value without a specific reference through digital coding of a semiconductor memory apparatus according to another embodiment of the present invention.

Referring to FIG. 9, the semiconductor memory apparatus may discriminate HRS/LRS states without a special reference through digital coding. To this end, the data needs to be stored in the array 10 in the DC-balanced state. The DC-balanced state means a state including the same number of memory cells of the HRS/LRS state. To this end, the write operation is performed by the following process.

Figure 10:
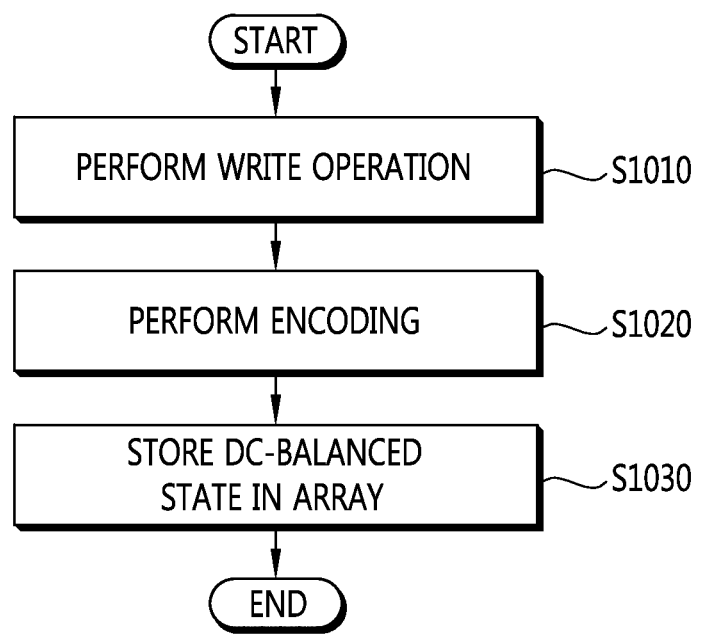
FIG. 10 is a diagram for describing a process of storing a cell array in a DC-balanced state through coding of the semiconductor memory apparatus according to another embodiment of the present invention.

FIG. 10 is a diagram for describing a process of storing a cell array 10 in a DC-balanced state through coding of the semiconductor memory apparatus according to another embodiment of the present invention. Referring to FIG. 10, the semiconductor memory apparatus according to another embodiment of the present invention performs a write operation (S1010). The semiconductor memory apparatus performs encoding during the write operation (S1020), and stores data to the array 10 in the DC-balanced state (S1030).

According to another embodiment of the present invention, the semiconductor memory apparatus performs a verify read operation with respect to the array 10 in the DC-balanced state (S910). During the verify read operation, the digital code values associated with the read resistances are arranged according to size (S920). In addition, it is determined whether the resistance of each memory cell 12 in the array 10 has a half or more of size or a half or less of size of all the memory cells based on the arranged digital code value (S930). Here, i means a number of each memory cell 12 arranged according to size, and n means the number of all the memory cells 12.

As a result, the memory cells 12 having smaller resistances than a half of all the memory cells 12 are discriminated to have the HRS state (S940), and the memory cells 12 having larger resistances than a half of all the memory cells 12 are discriminated to have the LRS state (S942). In addition, the discriminated state value is encoded (S950).

When the state value of the data is discriminated by the above method, since the state value may be discriminated by an order which is not larger or smaller than the predetermined reference, the reference itself is not required. Further, when the cells which are locally collected are read, the distribution characteristic is not good and thus inconvenience that the reference needs to be changed may be solved.

Figure 11:
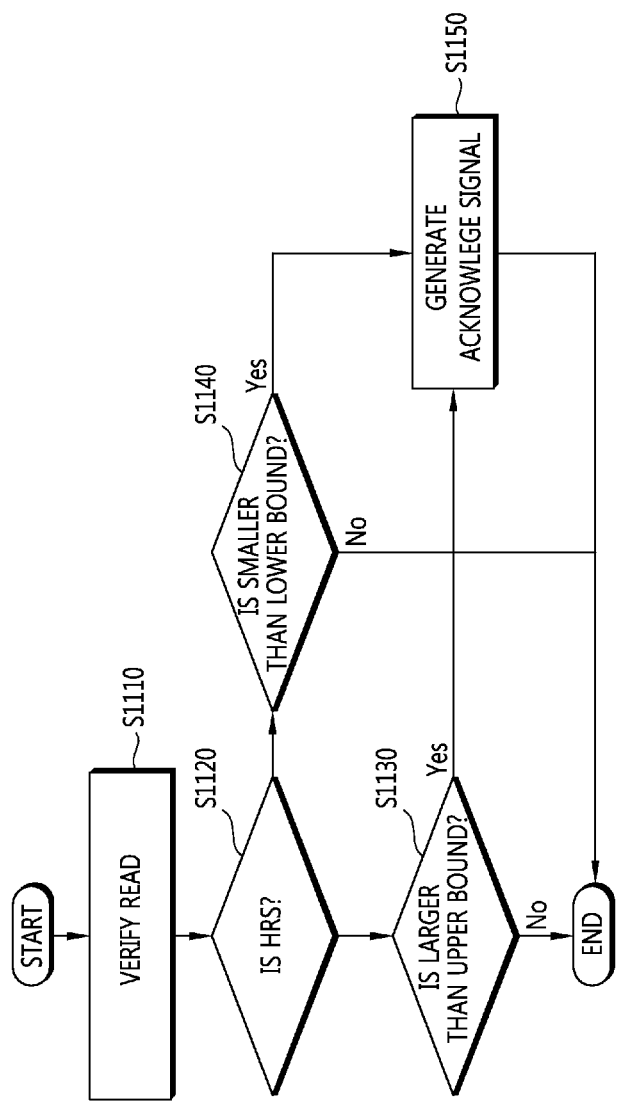
FIG. 11 is a flowchart schematically illustrating a process of detecting a digital code value having fail possibility of a semiconductor memory apparatus according to yet another embodiment of the present invention.

FIG. 11 is a flowchart schematically illustrating a process of detecting a digital code value having fail possibility of a semiconductor memory apparatus according to yet another embodiment of the present invention.

Referring to FIG. 11, a semiconductor memory apparatus according to yet another embodiment of the present invention performs verify read for each memory cell 12 (S1110). As the read result, the semiconductor memory apparatus determines whether the value is an HRS value based on the digital code value of the memory cell 12 (S1120). As the determined result, the semiconductor memory apparatus sets an upper bound with respect to the memory cell 12 of the LRS state other than the HRS state and determines whether the memory cell 12 has a resistance smaller than the upper bound (S1130). On the contrary, as the determined result, the semiconductor memory apparatus sets a lower bound with respect to the memory cell 12 of the HRS state and determines whether the memory cell 12 has a resistance larger than the lower bound (S1140). As a result of determining whether the memory cell 12 of the LRS state is the upper bound or less and determining whether the memory cell 12 of the HRS state is the lower bound or more, an acknowledge signal (ACK) is generated with respect to the memory cells 12 corresponding to a case where the memory cell 12 of the LRS state is larger than the upper bound and a case where the memory cell 12 of the HRS state is smaller than the lower bound (S1150) to sense a risk, and if not, it is determined that a current risk is not sensed, and then the entire process may end.

Figure 12:
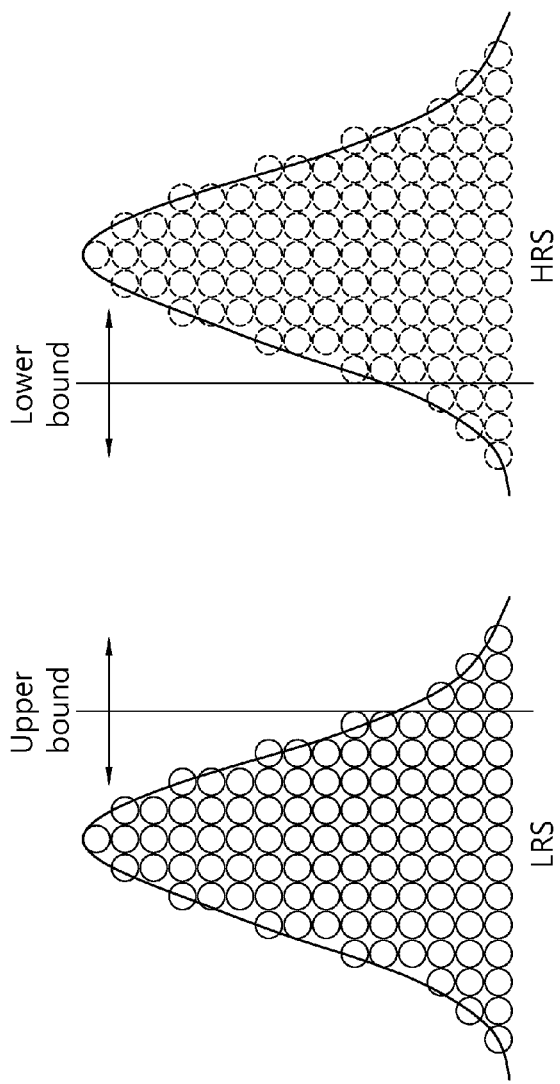
FIG. 12 is a conceptual diagram for describing detection of a resistive cell having fail possibility of the semiconductor memory apparatus according to yet another embodiment of the present invention.

FIG. 12 is a conceptual diagram for describing detection of a resistive cell having fail possibility of the semiconductor memory apparatus according to yet another embodiment of the present invention.

Referring to FIG. 12, the semiconductor memory apparatus according to yet another embodiment of the present invention sets a lower bound with respect to the memory cells 12 read in the HRS state, and in the case of larger than the lower bound, the memory cells 12 read in the HRS state have a good characteristic, but in the case of smaller than the lower bound, since the memory cells 12 read in the HRS state have a similar value to the value of the LRS state, the ACK signal may be generated with respect to the HRS cells having the value of the lower bound or less. In this case, since the lower bound is reference for alerting a risk with respect to the memory cell 2 having the lowest value among the memory cells in the HRS state, the lower bound may be set as a smaller value than a median value of the memory cell resistances of the HRS state.

Like this, the semiconductor memory apparatus sets an upper bound with respect to the memory cells 12 read in the LRS state, and in the case of the LRS cell having smaller than the upper bound, the memory cells 12 read in the HRS state have a good characteristic, but in the case of the LRS cell having larger than the upper bound, since the memory cells 12 read in the LRS state have a similar value to the value of the HRS state, the ACK signal is generated with respect to the LRS cells to recognize a risk. On the contrary with the lower bound, since the upper bound is reference for alerting a risk with respect to the memory cell 2 having the highest value among the memory cells in the LRS state, the upper bound may be set as a larger value than a median value of the memory cell resistances of the LRS state.

Accordingly, it may be discriminated whether a risk degree of the memory cell 12 is less than or more than a predetermined level. Further, since the risk is sensed through the ACK signal, the sensed cells perform the refresh, and the cell characteristic may more certainly move to the HRS/LRS state. The lower/upper bounds may be changed through the distribution of the digital code values acquired through the ADC 32. For example, the fail possibility may be decreased by setting a more proper bound according to the distribution. When a difference in size of the data discriminated through the method is not large, the difference is recognized as deterioration, and the refresh is performed based thereon to decrease fail possibility.

Figure 13:
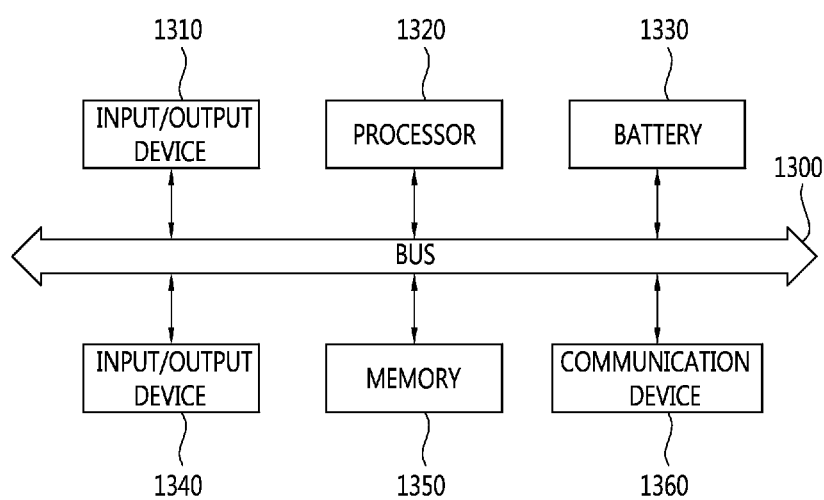
FIG. 13 is a schematic block diagram of a semiconductor memory system according to an embodiment of the present invention.

FIG. 13 is a schematic block diagram of a semiconductor memory system according to an embodiment of the present invention. A semiconductor memory system such as a computer includes a memory apparatus 1350 connected to a system bus 1300, and a processor 1320.

The processor 1320 may entirely control a record operation, a read operation, or a verify read operation of the memory apparatus 1350. For example, the processor 1320 outputs a command for controlling the record operation of the memory apparatus 1350, and recording data. Further, the processor 1120 may generate a command for controlling the read operation or the verify read operation of the memory apparatus 1350. Accordingly, the control block 40 of the semiconductor memory apparatus 1350 may perform the verify read operation or the program operation (or the record operation) in response to a control signal (for example, an nPRG, a DIS, a WEN, or a REN) output from the processor 1320. The control block 40 of the semiconductor memory apparatus 1350 may perform the refresh operation in response to the control signal from the processor 1320.

In the case where the semiconductor memory system is implemented as a portable application, the semiconductor memory system may further include a battery 1330 for supplying operation power to the memory apparatus 1350 and the processor 1320.

The portable application may include a portable computer, a digital camera, personal digital assistants (PDA), a cellular phone, an MP3 player, a portable multimedia player (PMP), an automotive navigation system, a memory card, a smart card, a game machine, an electronic dictionary, or a solid state disc.

The semiconductor system may further include an interface for transmitting and receiving data to and from an external data processing device, for example, input/output devices 1310 and 1340.

In the case where the semiconductor system is a wireless system, the semiconductor system may further include a memory apparatus 1350, a processor 1320, and a communication device 1360. In this case, the communication device 1360 is connected to the processor 1320 as a wireless interface, and may wirelessly transmit and receive the data to and from an external wireless device (not illustrated) through the system bus 1300.

For example, the processor 1320 processes the data input through the communication device 1360 to store the processed data in the memory apparatus 1350, and further, the data stored in the memory apparatus 1350 may be read to be transmitted to the wireless interface 1360.

The wireless system including the communication device 1360 may be a wireless device such as a PDA, a portable computer, a wireless telephone, a pager, and a digital camera, an RFID reader, or an RFID system. Further, the wireless system may be a wireless local area network system or a wireless personal area network (WPAN) system. Further, the wireless system may be a cellular network.

While the invention has been shown and described with respect to the preferred embodiments, it will be understood by those skilled in the art that various changes and modifications may be made without departing from the spirit and scope of the invention as defined in the following claims.

What is claimed is:

1. A semiconductor memory apparatus, comprising:
a memory cell array including resistive memory cells; and
a control block controlling a resistance state of the resistive memory cells to be discriminated based on a digital code value of the resistive memory cells, the digital code value having at least 2 bits, wherein the digital code value reflects the resistance state of the resistive memory cells,
wherein
the control block varies a reference value discriminating a state value including SET(1) or RESET(0) of the data by analyzing a distribution of the resistive memory cells based on the digital code value during a verify read operation,
wherein
the control block sets a local reference value by using the digital code value of the resistive memory cells upon the resistive memory cells of a read unit being accessed to perform a single read command,
wherein
the read unit comprising the resistive memory cells that are accessed to perform the single read command is encoded to have at least one cell having the respective state values of SET(1) and at least one cell having the respective state values of RESET(0).

2. The semiconductor memory apparatus of claim 1, wherein:
the digital code value is generated as the digital code value of at least 2 bits according to a degree in which the resistance states of the resistive memory cells deviate from a target value.

3. The semiconductor memory apparatus of claim 1, wherein:
the control block determines binary data stored in the resistive memory cell by using a most significant bit (MSB) of the digital code value, and acquires distribution information of the resistive memory cells by using bits other than the MSB.

4. The semiconductor memory apparatus of claim 1, wherein:
the control block groups the resistive memory cells into a first group and a second group based on the information related with the distribution of the resistive memory cells, and
varies the reference value based on at least one of an average value, a central value, a standard deviation, and minimum and maximum of the resistive memory cells belonging to the first group and the resistive memory cells belonging to the second group.

5. The semiconductor memory apparatus of claim 4, wherein:
the control block varies the reference value as an average value of a maximum of the digital code values of the resistive memory cells belonging to the first group and a minimum of the digital code values of the resistive memory cells belonging to the second group.

6. The semiconductor memory apparatus of claim 1, wherein:
the control block sets a median value between the digital code value of the farthest cells on the distribution of the digital code values of the resistive memory cells belonging to the read unit as the local reference.

7. The semiconductor memory apparatus of claim 1, wherein:
the control block controls a refresh operation to be performed in order to compensate for a deterioration characteristic of the resistive memory cell when a distance between the digital code values of the farthest cells is not beyond a predetermined reference value.

8. The semiconductor memory apparatus of claim 1, wherein:
the control block groups the plurality of resistive memory cells into a first group and a second group based on the information related with the distribution of the resistive memory cells, and
manages the resistive memory cells based on whether resistive memory cells deviates from first and second references by applying the first reference to the first group and the second reference to the second group.

9. The semiconductor memory apparatus of claim 8, wherein:
the first group is a group representing a high resistance state (HRS), and the second group is a group representing a low resistance state (LRS), and
the resistive memory cells belonging to the first group having a lower value than the first reference and the resistive memory cells belonging to the second group having a higher value than the second reference are recognized to have a performance deterioration risk and generate risk sensing signals.

10. The semiconductor memory apparatus of claim 8, wherein:
the control block controls the resistive memory cells belonging to the first group and the second group which are beyond the first and second references to perform the refresh operation.

11. A verify read method of a semiconductor memory apparatus, comprising:
generating digital code values reflecting resistance states of resistive memory cells; and
controlling a resistance state of the resistive memory cells to be discriminated based on a digital code value of at least 2 bits, wherein the digital code value reflects the resistance states of the resistive memory cells,
wherein
the control block varies a reference value discriminating a state value including SET(1) or RESET(0) of the data by analyzing a distribution of the resistive memory cells based on the digital code value during the verify read operation,
wherein
the control block sets a local reference value by using the digital code value of the resistive memory cells upon the resistive memory cells of a read unit being accessed to perform a single read command,
wherein
the read unit comprising the resistive memory cells that are accessed to perform the single read command is encoded to have at least one cell having the respective state values of SET(1) and at least one cell having the respective state values of RESET(0).

12. A semiconductor memory system, comprising:
a semiconductor memory apparatus; and
a processor for controlling a write operation and a verify read operation of the semiconductor memory apparatus,
wherein the semiconductor memory apparatus includes
a memory cell array including resistive memory cells; and
a control block controlling a resistance state of the resistive memory cells to be discriminated based on a digital code value of the resistive memory cells, the digital code value having at least 2 bits, wherein the digital code value reflects the resistance state of the resistive memory cells,
wherein
the control block varies a reference value discriminating a state value including SET(1) or RESET(0) of the data by analyzing a distribution of the resistive memory cells based on the digital code value during the verify read operation,
wherein
the control block sets a local reference value by using the digital code value of the resistive memory cells upon the resistive memory cells of a read unit being accessed to perform a single read command,
wherein
the read unit comprising the resistive memory cells that are accessed to perform the single read command is encoded to have at least one cell having the respective state values of SET(1) and at least one cell having the respective state values of RESET(0).

* * * * *